United States Patent [19]

Schäfer

[11] Patent Number: 4,912,190

[45] Date of Patent: Mar. 27, 1990

[54] EPOXY RESIN FORMULATION HAVING AN EXTREMELY SHORT HARDENING TIME FOR THE PRODUCTION OF EPOXY GLASS LAMINATES IN CONTINUOUSLY OPERATING DOUBLE-BELT PRESSES

[75] Inventor: Hans-Jürgen Schäfer, Vellman, Fed. Rep. of Germany

[73] Assignee: AEG Isolier- Und Kunststoff GmbH, Kassel, Fed. Rep. of Germany

[21] Appl. No.: 191,030

[22] Filed: May 6, 1988

[30] Foreign Application Priority Data

May 6, 1987 [DE] Fed. Rep. of Germany ....... 3714997

[51] Int. Cl.⁴ ...................... C08G 59/56; C08G 59/68
[52] U.S. Cl. ...................................... 528/94; 528/102; 528/117; 528/407
[58] Field of Search .................. 528/117, 407, 102, 94

[56] References Cited

U.S. PATENT DOCUMENTS

| 3,438,937 | 4/1969 | Christie ................................ 528/117 |
| 3,489,695 | 1/1970 | Green .................................. 528/117 |
| 4,041,007 | 8/1977 | Waters ............................. 528/117 X |
| 4,246,394 | 1/1981 | Schülde et al. ..................... 528/117 |
| 4,420,605 | 12/1983 | Kaufman .......................... 528/117 X |
| 4,459,398 | 7/1984 | Dearlove et al. ................ 528/117 X |
| 4,529,537 | 7/1985 | Dockner et al. ................. 528/117 X |

FOREIGN PATENT DOCUMENTS 3327823  2/1985  Fed. Rep. of Germany .

OTHER PUBLICATIONS

"Dow Epoxy Resins in Electrical Laminates", Dow Chemical, FIGS. 2, 3 and 4 and Table 2.

Primary Examiner—Earl Nielsen
Attorney, Agent, or Firm—Spencer & Frank

[57] ABSTRACT

An epoxy resin composition, including epoxy resin, cyanamide as a hardener, and 2-methylimidazole or 2,4-ethyl-methylimidazole as an accelerator in hardening the epoxy resin.

15 Claims, 1 Drawing Sheet

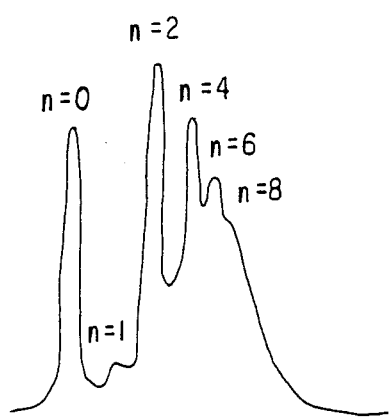

EPOXY RESIN FORMULATION HAVING AN EXTREMELY SHORT HARDENING TIME FOR THE PRODUCTION OF EPOXY GLASS LAMINATES IN CONTINUOUSLY OPERATING DOUBLE-BELT PRESSES

FIELD OF THE INVENTION

This invention relates to epoxy compositions having a short hardening time. These compositions may be used to prepare epoxy glass laminates covered on one or both sides with a copper foil and which can be used for the production of circuit boards or printed circuits.

TECHNOLOGY REVIEW

Resins used customarily to prepare epoxy glass laminates are, for example, brominated epoxy resins on a bisphenol-A basis.

|         | Epoxy equivalent | Bromine content |
|---------|------------------|-----------------|
| Resin A | 460–510          | 18–22           |
| Resin B | 500–530          | 21–23           |
| Resin C | 665–725          | 24–26           |

These resins are normally hardened with dicyanodiamide

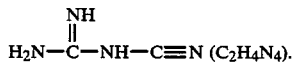

The hardener is used in quantities of 3 to 3.5% by weight with respect to weight of the solid resin.

The accelerators (catalysts) employed are N-benzyl dimethylamine (BDMA), and N,N,N,N-tetramethyl-1,3-butanediamine (TMBDA).

A comparison of the hardening times indicate that varying the amount of dicyanodiamide hardener with a constant amount of accelerator has a great influence on the reaction time. The hardener dicyanodiamide, however, is difficult to dissolve. It is therefore recommended by those experienced in the art to use not more than 3.5 parts. This imposes a lower limit on the reaction time, i.e. the time required to harden the epoxy resin composition. With greater concentrations the laminate characteristics worsen, particularly the moisture stability. A worsening of the laminate charcteristics also occurs if the percentage of the accelerator BDMA is increased.

To produce epoxy glass laminates, glass fabrics, such as, for example, U.S. Style 7628, having a sheet weight of 200 g/m² are resinated with 40 to 45% epoxy resin. This may be done by impregnating the glass fabric with an appropriate resin solution and drying the so-called prepreg to a defined prehardening degree.

These prepregs are cut, stacked and hardened between sheets of high-grade steel in multi-layer presses under pressure and heat.

SUMMARY OF THE INVENTION

The present invention provides a resin formulation with which it is possible to realize hardening times of 1 minute at 190° C. with 95% hardening and to retain good laminate characteristics. To achieve this, the invention provides an accelerator which does not have the drawbacks described with BDMA. Surprisingly, we found that this is possible with 2-methylimidazole (2MI).

We have found that 2MI has a 30% faster hardening speed than 2-4-ethylmethylimidazole and a 200% faster hardening speed than BDMA.

Since dicyanodiamide in higher concentrations worsens the laminate characteristics, a new hardener had to be found. We have now found that cyanamide

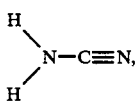

which is used in the synthesis of dicyanodiamide, is a superior hardener for epoxy glass laminates having a short hardening time. This hardener is soluble in water, alcohols and ketones. It thus has the advantage that it does not require high-boiling-point solvents, such as, for example methyl glycol and dimethyl formamide, as is the case for dicyanodiamide.

This is of decisive significance for extremely short reaction times particularly with respect to the residual solvent percentage. Additionally, cyanamide can be dissolved directly in the uncured resin, allowing curing without solvents.

Thus the present invention has the advantages that a greater amount of hardener may be used without deleterious effect on the stability of the cured resin and therefore shorter curing times are achieved, and low-boiling-point solvents can be used resulting in lower residual solvent percentages.

BRIEF DESCRIPTION OF THE DRAWING

The FIGURE illustrates the molecular weight distribution of an low molecular weight solid epoxy resin useful in the composition of the present invention (EEW approximately 450).

DETAILED DESCRIPTION OF THE INVENTION

The epoxy resin composition of the present invention includes an epoxy resin, preferably having an epoxy equivalent in the range from about 300 to about 400. The composition includes cyanamide which is used as a hardener for the resin, preferably in an amount about in the range 2–6% by weight of the resin.

The use of cyanamide has the advantage that additional solvents are not necessary to dissolve it, since cyanamide dissolves in the resin. However, if a solvent is used, it is advantageous to use solvents having relatively low boiling points, e.g., below 80° C. at atmospheric pressure. Additionally, if a solvent is used, the solution preferably contains at least 65% dissolved solids.

The composition of the present invention also contains 2-methylimidazole or 2,4-ethylmethylimidazole as an accelerator. Preferably, an amount of 2-methylimidazole is used which is in a range from about 0.1 to about 0.8% by weight compared to the weight of the epoxy resin.

The preferred method of curing the resin composition of the present invention involves heating the resin for about 30 to about 80 seconds at a temperature of about 170° C. followed by cooling the resin.

The following comparisons illustrate the greater stress resistance of the formulation of the present invention in comparison with the prior art.

| Prior Art | 125 parts epoxy resin (80%) |
| | 3.752 parts dicyanodiamide |
| | 0.4 parts 2MI |
| Present Invention | 125 parts epoxy resin (80%) |
| | 3.75 parts cyanamide |
| | 0.4 parts 2MI |

Reaction time at 95% hardening:

| | Prior Art | Present Invention |
|---|---|---|
| 100° C. | 315 min | 500 min |
| 150° C. | 11 min | 12 min |
| 180° C. | 2 min | 2 min |
| 190° C. | 1.2 min | 1 min |
| 200° C. | 0.8 min | 0.6 min |

Comparison of the solder bath resistance after being stressed in hot steam at 2 bar (120° C.):

| | Prior Art | Present Invention |
|---|---|---|
| Stress period | 2 hours | 4 hours |
| Resistance time | 20 s solder bath | 20 s solder bath |

The following Comparative Examples show the influence of the dicyanodiamide percentage on the reaction time in prior art formulations.

| Comparative Example 1 | 125 parts epoxy resin |
| | EEW (epoxy equivalent weight) 450 (80%) |
| | 3 parts dicyanodiamide |
| | 0.2 parts BDMA |
| | reaction time 240 s at 170° C. |
| Comparative Example 2 | 125 parts epoxy resin |
| | EEW (epoxy equivalent weight) 450 (80%) |
| | 3.5 parts dicyanodiamide |
| | 0.2 parts BDMA |
| | reaction time 200 s at 170° C. |

The following Table indicates the solder bath stability of prior art compositions.

| | SOLDER BATH STABILITY (260° C.) Solder bath resistance in seconds | | | | | | | | |
|---|---|---|---|---|---|---|---|---|---|
| LZ 8011 N-80 P.B.W. | | | | 125 | | | | | |
| HZ 986 R-10 P.B.W. | 30 | | | 35 | | | 40 | | |
| DY 062 P.B.W. | 0.2 | 0.4 | 0.8 | 0.2 | 0.4 | 0.8 | 0.2 | 0.4 | 0.8 |
| initial value | | >600 | 30 | | 50 | 18 | | 50 | 28 |
| after 1 h H$_2$O/100° C. | | 60 | 15 | >600 | 35 | >10 | >600 | 16 | 15 |
| after 2 h H$_2$O/100° C. | >600 | 25 | <10 | 30 | 26 | | | 15 | <10 | <10 |
| after 3 h H$_2$O/100° C. | 35 | 20 | | 25 | 21 | | <10 | | |
| after 4 h H$_2$O/100° C. | 25 | 14 | | 20 | 16 | | | | |
| after 5 h H$_2$O/100° C. | <10 | <10 | | <10 | <10 | | | | |

Tests made by Ciba Geigy HZ 986 R-10 = dicyanodiamide 10%
DY 062 = benzyldimethylamine (BDMA)
LZ 8011 N-80 = epoxy resin EEW (epoxy equivalent weight) 450 (80%)

It has been found to be particularly advantageous to employ a resin system which contains more than 50% low-molecular weight components.

$$n_0 + n_2 \geq 50\%$$ [Rx]$_n$

Surprisingly it was found that it is possible with the resin/hardener/accelerator combination according to the invention to make available a system for the continuous production of epoxy glass laminates which, with the shortest hardening times, does not exhibit the negative quality features encountered in the prior art. An example of a device and process for using the resin formulation of the present invention is given in Federal Republic of Germany Patent Applications P 37 11 969.9 filed Apr. 9th, 1987, and P 37 16 531.3 filed May 16th, 1987, which correspond to U.S. patent application No. 07/179,632, entitled "Method of Continuously Producing Band-Shaped Base Material," by the present inventor.

The present disclosure relates to the subject matter disclosed in Federal Republic of Germany Patent Application, No. P 37 14 997.0 filed May 6, 1987, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. An epoxy resin composition, comprising:
   an epoxy resin;
   a cyanamide hardener; and
   a 2-methylimidazole accelerator.

2. An epoxy resin composition as defined in claim 1, wherein the epoxy resin has an epoxy equivalent in a range of from about 300 to about 400.

3. An epoxy resin composition as defined in claim 1, further including at least one solvent having a boiling point of less than about 80° C. at atmospheric pressure.

4. A process for curing an epoxy resin, comprising: hardening an epoxy resin as defined in claim 1 for about 30 to about 80 seconds at a temperature of about 170° C.; and cooling said resin.

5. An epoxy resin composition as defined in claim 3, wherein the epoxy resin is dissolved in said solvent to form a solution comprising at least 65% dissolved solids.

6. An epoxy resin composition as defined in claim 1, wherein the cyanamide is dissolved in the epoxy resin, to allow curing of the resin without the use of solvents.

7. An epoxy resin composition as defined in claim 1, wherein the weight of cyanamide used is in a range from about 2 to about 6% of the weight of the epoxy resin.

8. An epoxy resin composition as defined in claim 1, wherein the accelerator is 2-methylimidazole and said 2-methylimidazole is present in a range from about 0.1 to about 0.8% by weight compared to the weight of the epoxy resin.

9. An epoxy resin composition, comprising:
an epoxy resin;
a cyanamide hardener; and
a 2,4-ethylmethylimidazole accelerator.

10. An epoxy resin composition as defined in claim 9, wherein the epoxy resin has an epoxy equivalent in a range of from about 300 to about 400.

11. An epoxy resin composition as defined in claim 9, further including at least one solvent having a boiling point of less than about 80° C. at atmospheric pressure.

12. A process for curing an epoxy resin, comprising: hardening an epoxy resin as defined in claim 9 for about 30 to about 80 seconds at a temperature of about 170° C.; and cooling said resin.

13. An epoxy resin composition as defined in claim 11, wherein the epoxy resin is dissolved in said solvent to form a solution comprising at least 65% dissolved solids.

14. An epoxy resin composition as defined in claim 9, wherein the cyanamide is dissolved in the epoxy resin, to allow curing of the resin without the use of solvents.

15. An epoxy resin composition as defined in claim 9, wherein the weight of cyanamide used is in a range from about 2 to about 6% of the weight of the epoxy resin.

* * * * *